(12) United States Patent
Shiozaki

(10) Patent No.: US 9,232,653 B2
(45) Date of Patent: Jan. 5, 2016

(54) MULTILAYER WIRING BOARD

(71) Applicant: Panasonic Corporation, Osaka (JP)

(72) Inventor: Ryosuke Shiozaki, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 78 days.

(21) Appl. No.: 14/122,889

(22) PCT Filed: Dec. 28, 2012

(86) PCT No.: PCT/JP2012/008432
§ 371 (c)(1),
(2) Date: Nov. 27, 2013

(87) PCT Pub. No.: WO2013/099286
PCT Pub. Date: Jul. 4, 2013

(65) Prior Publication Data
US 2014/0102778 A1    Apr. 17, 2014

(30) Foreign Application Priority Data

Dec. 28, 2011    (JP) .................................. 2011-289371

(51) Int. Cl.
*H05K 1/11* (2006.01)
*H05K 1/02* (2006.01)

(52) U.S. Cl.
CPC .............. *H05K 1/115* (2013.01); *H05K 1/0253* (2013.01); *H05K 1/0251* (2013.01)

(58) Field of Classification Search
CPC ... H05K 1/0253; H05K 1/0251; H05K 1/113; H05K 1/114; H05K 1/115; H05K 1/116
See application file for complete search history.

(56) References Cited

U.S. PATENT DOCUMENTS

| | | | |
|---|---|---|---|
| 6,184,478 B1 | 2/2001 | Imano et al. | |
| 6,710,258 B2* | 3/2004 | Oggioni et al. | 174/255 |
| 2003/0133279 A1* | 7/2003 | Shirasaki | 361/795 |
| 2007/0222052 A1 | 9/2007 | Kabumoto | |
| 2010/0282503 A1* | 11/2010 | Kushta | 174/266 |

FOREIGN PATENT DOCUMENTS

| | | |
|---|---|---|
| JP | 2000114722 A | 4/2000 |
| JP | 2003060351 A | 2/2003 |
| JP | 2007288180 A | 11/2007 |

OTHER PUBLICATIONS

International Search Report dated Apr. 9, 2013, for corresponding International Application No. PCT/JP2012/008432, 6 pages.

* cited by examiner

*Primary Examiner* — Jeremy C Norris
(74) *Attorney, Agent, or Firm* — Seed IP Law Group PLLC

(57) ABSTRACT

Provided is a multilayer wiring board, wherein impedance matching can be achieved in a via connection section by means of a configuration, which has a simple structure, and which can be easily processed. In the multilayer wiring board including a ground layer (401) of a layer (1), and a signal line (102) of a layer (2), an elliptical through hole is formed in the ground layer (401), said through hole being at a position facing a part of the signal line (102). The elliptical through hole overlaps the signal line (102) by a length of lambda/36-lambda/2 in the long axis direction, Impedance of the signal line (102) can be adjusted by adjusting the size of the through hole.

5 Claims, 13 Drawing Sheets

EQUAL TO OR GREATER THAN $\lambda/36$
BUT NOT GREATER THAN $\lambda/2$

MULTILAYER WIRING BOARD

TECHNICAL FIELD

The present invention relates to a multilayer wiring board including a via that connects signal lines (transmission lines) of different layers.

BACKGROUND ART

As a structure for mutually connecting wiring patterns which are located in desired layers of a board having two or more wiring layers, there is a structure called a through hole or a via (or via hole). Particularly, a structure to connect inner layers of a multilayer board using a hole is called a via.

FIG. 1 is a diagram schematically illustrating a multilayer board including a via. FIG. 1 shows a four-layer structure including layer 1 which is ground layer 11, layer 2 which is signal line 12, layer 3 which is signal line 13, and layer 4 which is ground layer 14. Via 15 connects the signal lines of layer 2 and layer 3. Meanwhile, signal line 12 is connected to, for example, a high-frequency amplifier, and signal line 13 is connected to, for example, an antenna.

Generally, a via is formed of a complicated shape, and impedance mismatching occurs in a connecting part between a signal line having a constant line width and a via. For this reason, it is known that signal transmission characteristics, particularly, at the time of high-frequency driving deteriorate. That is, the reflection and attenuation of a signal occurs in the connecting part between the signal line and the via.

In this respect, PTL 1 proposes a method for improving the electrical characteristics of the via structure. For example, PTL 1 proposes a method for performing pseudo-coaxialization on vias provided in the vertical direction of an insulating board, using a plurality of ground layers lined up on the insulating board located in the vicinity of the vias. In addition, PTL 1 proposes a multilayer board including stacked layers and having a structure in which coaxial via holes spaced apart at regular intervals are formed in the vicinity of the vias by laser processing, and the coaxial via holes are connected to a power supply and ground layer.

Further, as shown in FIG. 2, PTL 1 proposes a multilayer wiring board in which insulating layers each formed using a resin insulating film and wiring layers each formed using a conductor film are alternately stacked one on top of another. This multilayer wiring board includes via holes which are connected to signal transmission wiring and via holes which are independently formed in the vicinity of the vias coaxially on concentric circles separated at a regular interval by the insulating layer without being connected to a signal wiring layer, a power supply and a ground layer, and are buried in the insulating resin layer.

CITATION LIST

Patent Literature

PTL 1
Japanese Patent Application Laid-Open No. 2003-060351

SUMMARY OF INVENTION

Technical Problem

However, in the technique disclosed in PTL 1 mentioned above, there remain problems in that the structure is complicated and in that the processing is not easy.

An object of the present invention is to provide a simple-structure and easily-processable multilayer wiring board in which impedances are matched in a via connecting part.

Solution to Problem

A multilayer wiring board according to an aspect of the present invention includes a signal line; and a ground layer including a pattern formed at a position facing a portion of the signal line, the pattern being not covered with a metal film.

Advantageous Effects of Invention

According to the present invention, impedances can be matched in a via connecting part, using a simple-structure and easily-processable configuration.

DESCRIPTION OF EMBODIMENTS

Figure 1:
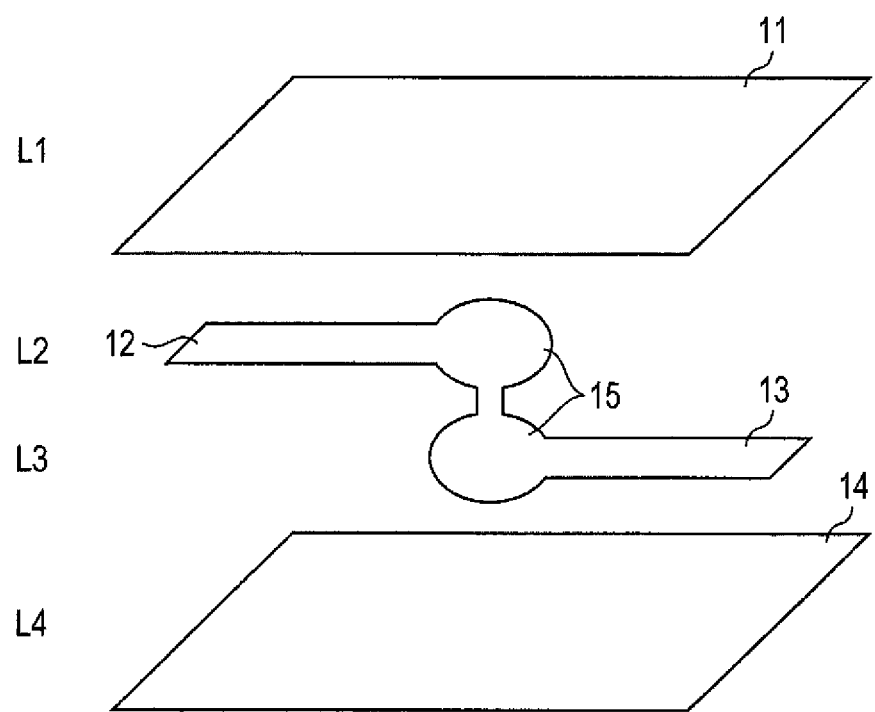
FIG. 1 is a diagram schematically illustrating a multilayer board including a via.
Figure 2:
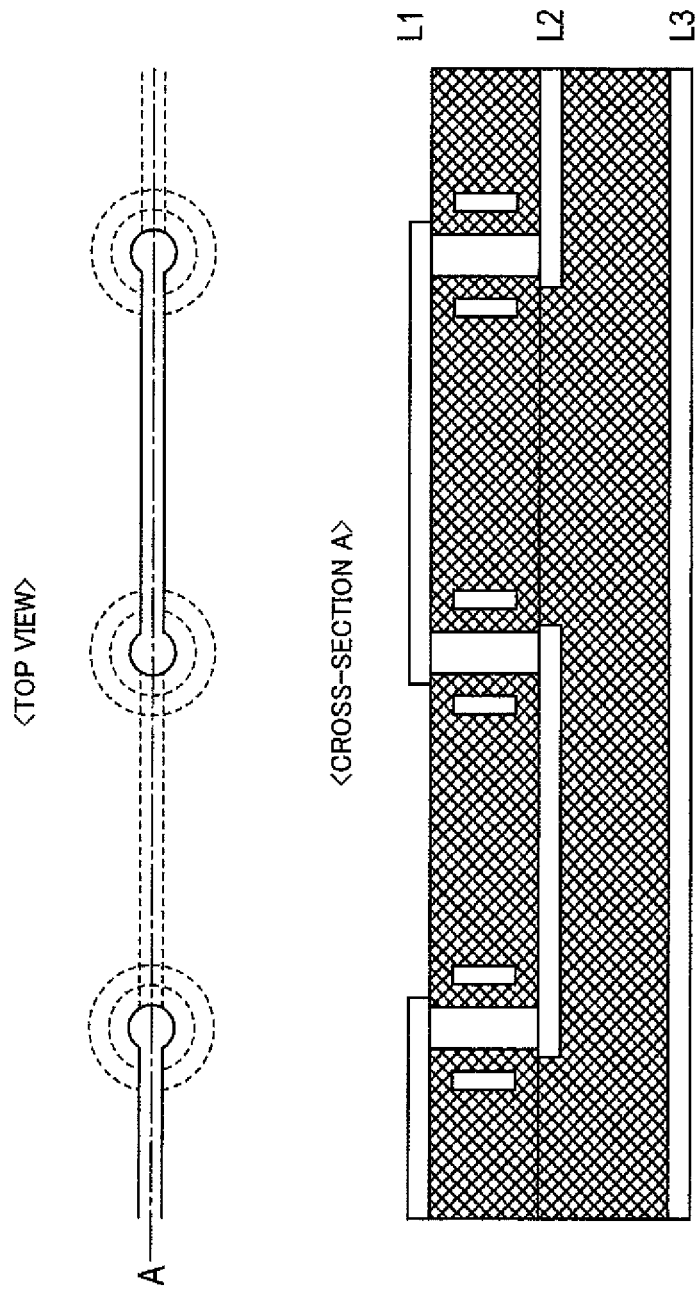
FIG. 2 is a cross-sectional view illustrating a wiring structure including via holes disclosed in PTL 1.

Hereinafter, embodiments of the present invention will be described in detail with reference to the accompanying drawings. However, in the embodiments, the same components are denoted by the same reference numerals, and the redundant description thereof will be omitted.

(Embodiment 1)

Figure 3:
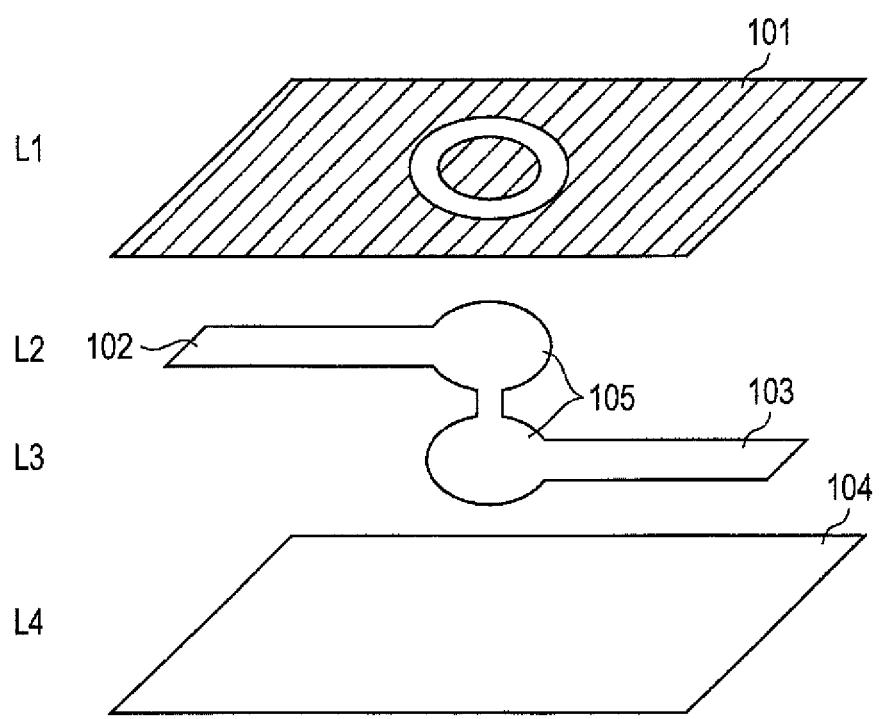
FIG. 3 is an exploded perspective view illustrating a wiring structure including a via according to Embodiment 1 of the present invention.

FIG. 3 is an exploded perspective view illustrating a wiring structure including a via according to Embodiment 1 of the present invention. In the wiring structure of FIG. 3, a four-layer structure including ground layer 101 (layer 1), signal line 102 (layer 2), signal line 103 (layer 3) and ground layer 104 (layer 4) is shown. Via 105 connects signal line 102 of layer 2 and signal line 103 of layer 3.

Figure 4:
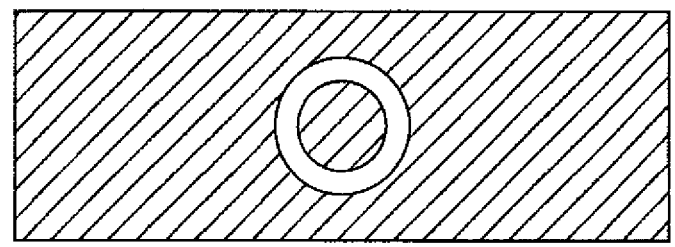
FIG. 4 is a plan view illustrating a ground layer of FIG. 3.

FIG. 4 shows a plan view of ground layer 101 of FIG. 3. Ground layer 101 is formed at a position where a circular ring-shaped pattern not covered with a metal film such as copper foil (shown by diagonal lines in the drawing) faces the via.

Figure 5:
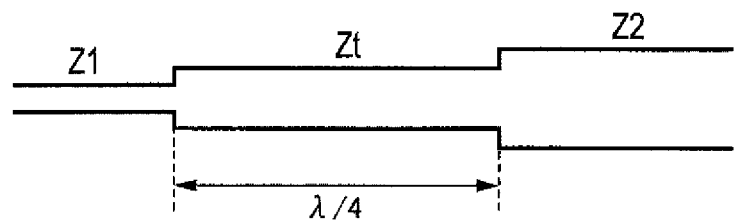
FIG. 5 is a diagram illustrating a signal line including a general $\lambda/4$ transformer.

FIG. 5 shows a general $\lambda/4$ transformer. In FIG. 5, in order to match impedances between Z1 and Z2, the $\lambda/4$ transformer having impedance characteristic Zt is inserted into the signal line.

In contrast, in FIG. 4, in a connecting part between signal lines 102 and 103 and via 105 impedances can be matched by forming the circular ring-shaped pattern on ground layer 101. That is, impedance matching can be realized without using the $\lambda/4$ transformer with which the line width shown in FIG. 5 is changed. In addition, electric lines of force are concentrated on via 105, and thus it is possible to reduce a radiation loss of electromagnetic waves radiated from the circular ring-shaped pattern. Further, impedance matching in via connecting part 105 can be realized by simple processing such as the formation of a pattern on a ground layer.

Figure 6A:
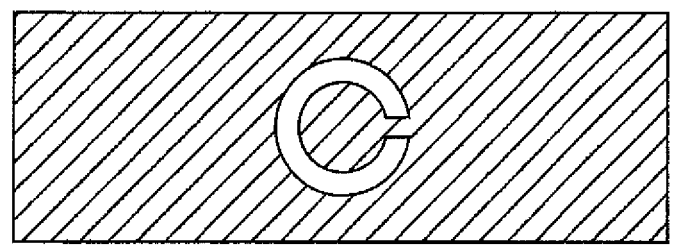
FIGS. 6A to 6C are plan views each illustrating a ground layer on which a circular pattern is formed.

The present invention is not limited to the circular ring-shaped pattern shown in FIG. 4. As shown in FIG. 6A, even when a metal film within a ring is a circular C-shape pattern which is connected to a portion of a ground and the ring, and a circular reverse C-shape pattern shown in FIG. 6B, the same effect mentioned above is obtained. Further, as shown in FIG. 6C, even when the metal film within the ring is a pattern formed by cutting the circular ring connected to the ground into two pieces in two different places of the ring, the same effect mentioned above is obtained.

Figure 6B:
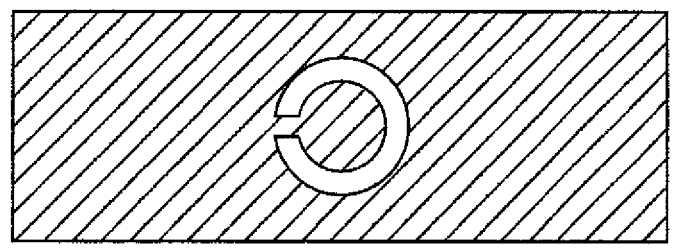
Figure 6C:
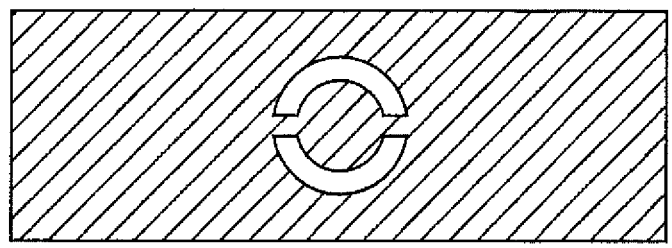
Figure 7A:
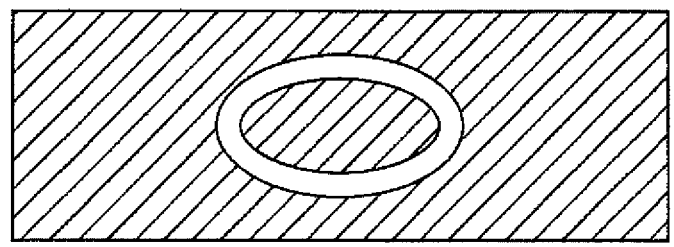
FIGS. 7A to 7D are plan views each illustrating a ground layer on which an elliptical pattern is formed.
Figure 7B:
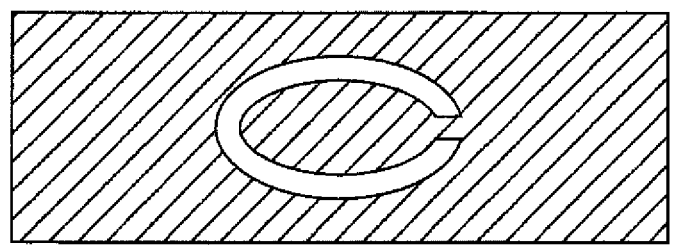
Figure 7C:
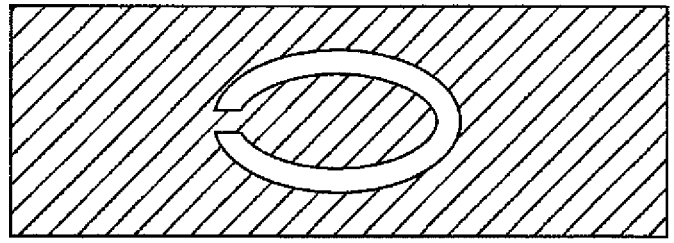
Figure 7D:
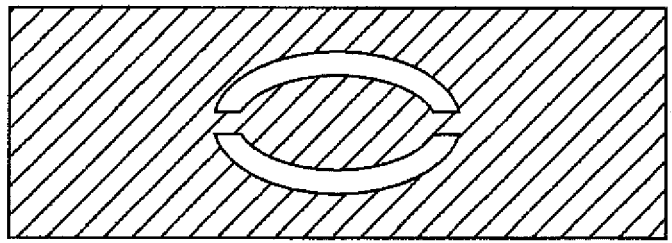

In addition, the present invention may have an elliptical ring-shaped pattern shown in FIG. 7A without being limited to a circle. Meanwhile, as is the case with the circular shape of FIGS. 6A to 6C even in a case of the elliptical ring shape, an elliptical C-shape pattern shown in FIG. 7B, an elliptical reverse C-shape pattern shown in FIG. 7C, and a 2-cut pattern of an elliptical ring shown in FIG. 7D may be used, and the same effect mentioned above is obtained.

Figure 8A:
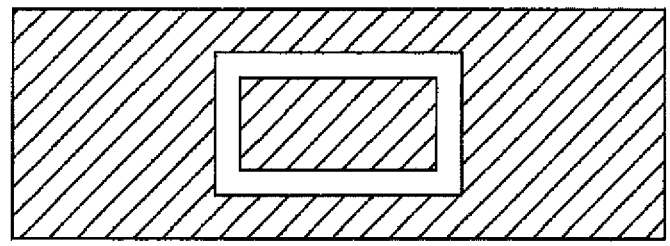
FIGS. 8A to 8D are plan views each illustrating a ground layer on which a rectangular pattern is formed.
Figure 8B:
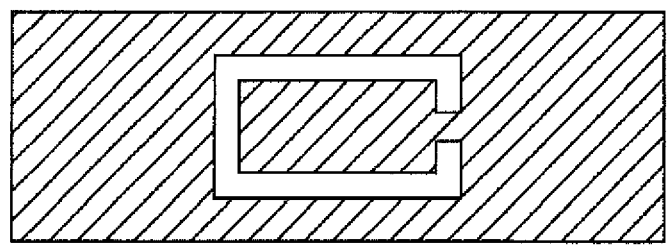
Figure 8C:
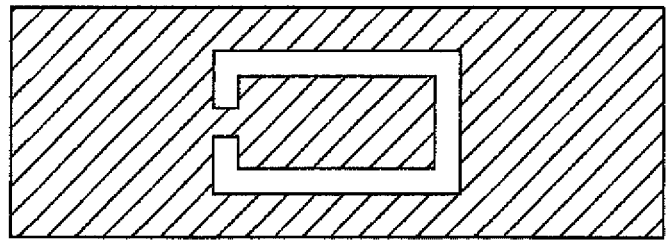
Figure 8D:
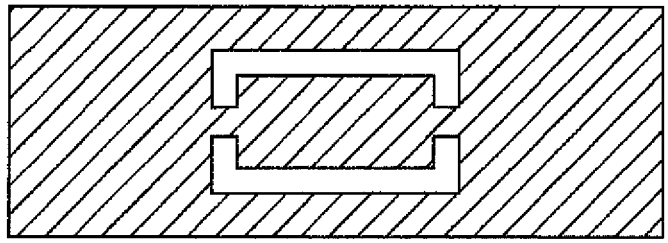

Further, the present invention may have a rectangular ring-shaped pattern shown in FIG. 8A without being limited to a circle and an ellipse. Meanwhile, as is the case with the circular shape of FIG. 6 even in a case of the rectangular ring shape, a rectangular C-shape pattern shown in FIG. 8B, a rectangular reverse C-shape pattern shown in FIG. 8C, and a 2-cut pattern of a rectangular ring shown in FIG. 8D may be used, and the same effect mentioned above is obtained.

Figure 9A:
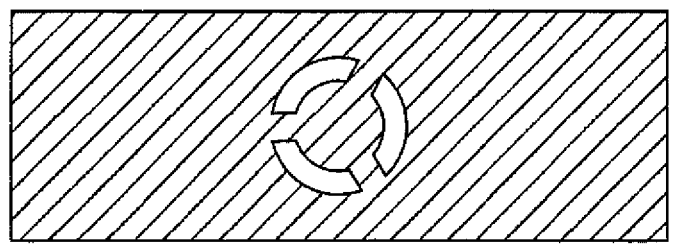
FIGS. 9A and 9B are plan views each illustrating a ground layer on which a cut circular pattern is formed.
Figure 9B:
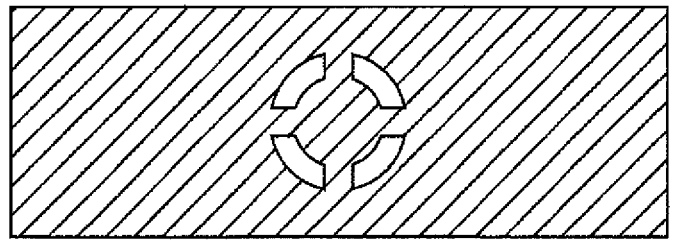

In addition, the 2-cut pattern of the circular ring shown in FIG. 6C may be a 3-cut pattern shown in FIG. 9A and a 4-cut pattern shown in FIG. 9B. However, it is preferable that the shape of the cut pattern be symmetric with respect to a line.

In addition, when the circular ring-shaped pattern shown in FIG. 4 is defined as a 0-cut pattern, and a 1-cut pattern is defined as the C-shape pattern shown in FIG. 6A or 6B, the pattern can be expanded to an n-cut pattern (n is an integer equal to or greater than 0). Meanwhile, it is preferable that the shape of the 1-cut pattern in FIGS. 6A to 6C, 7A to 7D, and 8A to 8D be vertically symmetric with respect to the plane of the drawing.

Here, when impedances in the ring-shaped pattern and the C-shape pattern (regardless of the shape) are compared with each other, these impedances are different from each other. This is attributed to the fact that in the ring-shaped pattern, the metal film and the ground within the ring are equal to C-shape binding, and in the C-shape pattern, the metal film and the ground in the inside of the pattern are equal to L-type binding because they are connected to each other using a thin line width.

As stated above, according to Embodiment 1, the ring-shaped pattern not covered with the metal film is formed at a position facing the via in the ground layer, and thus it is possible to simplify the configuration and to match impedances in the connecting part between the signal line and the via. In addition, it is possible to reduce a radiation loss of electromagnetic waves radiated from the ring portion.

Meanwhile, in the present embodiment, although the limitation of the pattern on the ground layer of layer 1 is described, the present invention is not limited to this configuration. The pattern may be formed on the ground layer of layer 4 in addition to the ground layer of layer 1. The pattern formed on the ground layer of layer 1 and the pattern formed on the ground layer of layer 4 may be combined optionally.

(Embodiment 2)

Figure 10:
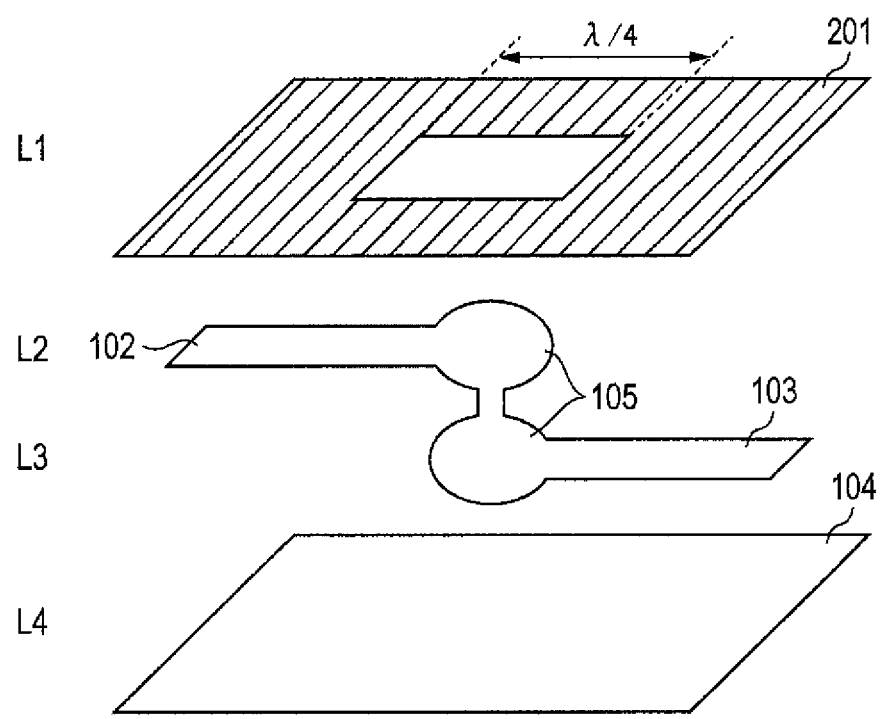
FIG. 10 is an exploded perspective view illustrating a wiring structure including a via according to Embodiment 2 of the present invention.

FIG. 10 is an exploded perspective view illustrating a wiring structure including a via according to Embodiment 2 of the present invention. In the wiring structure in FIG. 10, ground layer 201 (layer 1) is formed at a position where a rectangular through hole faces a portion of via 105 and signal line 102. One side of the through hole along signal line 102 has a length of $\lambda/4$. The formation of the through hole shown in FIG. 10 in ground layer 201 is equivalent to a pseudo change in the signal line, and thus impedances can be matched between the signal line and the via.

Figure 11A:
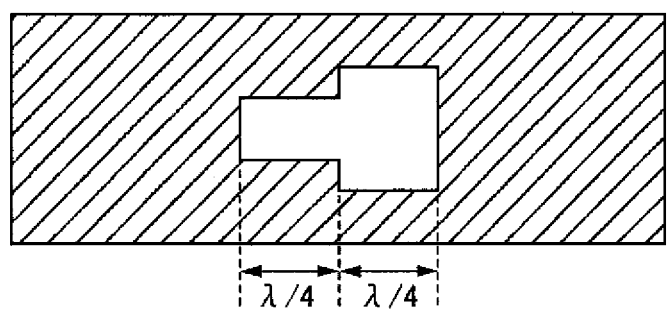
FIGS. 11A and 11B are plan views each illustrating a ground layer on which a through hole is formed.

The present invention is not limited to the rectangular through hole shown in FIG. 10. As shown in FIG. 11A, the same effect mentioned above is obtained with a protruding through hole formed of two contiguous rectangular through holes each having a different width and a length of a side along the signal line equal to a length of $\lambda/4$. Meanwhile, regarding the direction of the protruding through hole layer 2, the direction of a rectangular portion having a small width can be adjusted in accordance with the impedance of layer 3. Therefore, there is the same effect as inserting a general multistage transformer into the signal line, and impedances can be matched with a wider-band signal.

Figure 11B:
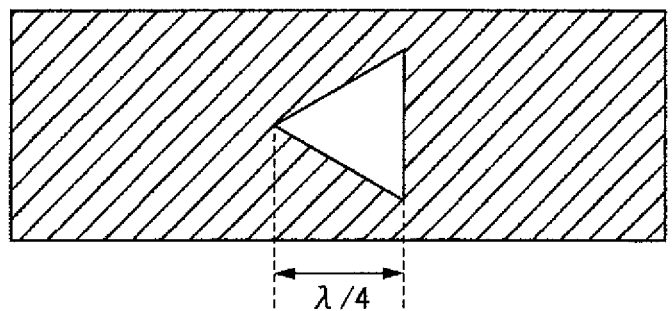

In addition, even with a tapered through hole having a height equal to a length of $\lambda/4$ along the signal line as shown in FIG. 11B, the same effect mentioned above is obtained.

According to Embodiment 2, in the ground layer, the through hole having a length of $\lambda/4$ along the signal line is formed at a position facing a portion of the via and the signal line, and thus impedances can be matched in the connecting part between the signal line and the via.

Meanwhile, the ground layer in which the through hole in the present embodiment is formed and the ground layer on which the pattern in Embodiment 1 is formed may be combined optionally. In addition, in the present embodiment, the length of one side of the through hole is described as $\lambda/4$ in FIGS. 10, 11A and 11B. However, even when the length of one side is equal to or greater than $\lambda/32$ and equal to or less than $\lambda/2$, the same effect can be obtained.

(Embodiment 3)

In Embodiment 1 and Embodiment 2, a case has been described in which impedance mismatching in the via is eliminated, whereas in Embodiment 3 of the present invention, a case will be described in which impedance matching is performed in the signal line rather than the via.

Figure 12:
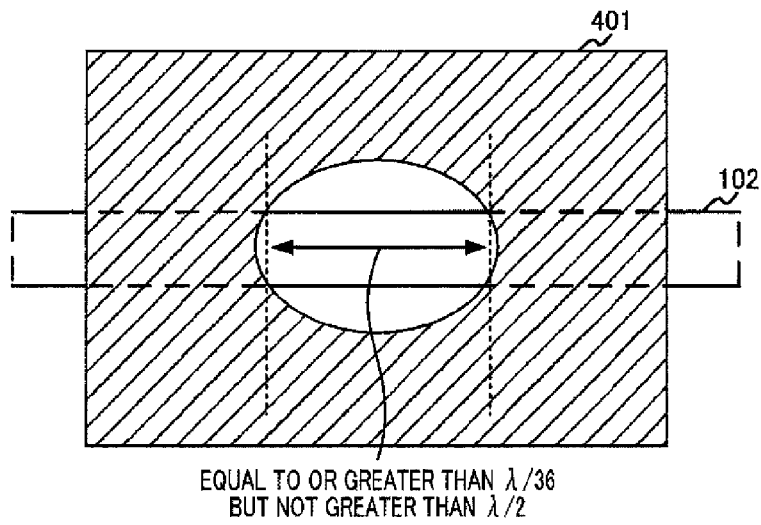
FIG. 12 is a plan view illustrating a wiring structure according to Embodiment 3 of the present invention.

FIG. 12 is a plan view illustrating a wiring structure according to Embodiment 3 of the present invention. In FIG. 12, in ground layer 401, an elliptical through hole is formed at a position facing a portion of signal line 102. The elliptical through hole has a length equal to or greater than λ/36 and equal to or less than λ/2 in a long-axis direction, and overlaps signal line 102.

In this manner, the formation of the elliptical through hole in ground layer 401 is equivalent to a pseudo change in the signal line, and thus impedances can be matched in the signal line. In addition, the ground layer is located as the upper layer of the signal line. Therefore, even after the signal line is installed, impedances can be adjusted just by adjusting the size of the through hole.

Figure 13:
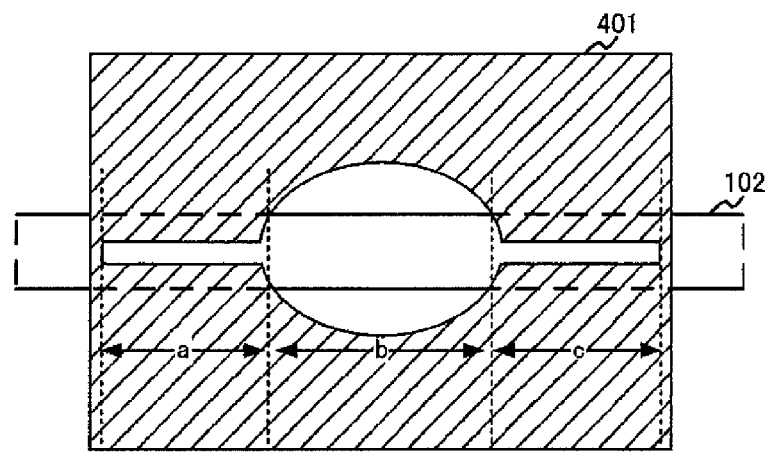
FIG. 13 is a plan view illustrating another wiring structure according to Embodiment 3 of the present invention.

The present invention is not limited to the elliptical through hole illustrated in FIG. 12. As shown in FIG. 13, rectangular through holes may be continuously provided on both sides of the long axis of an ellipse. However, the width of each of the rectangular through holes is set to be smaller than the line width of the signal line. Here, as shown in FIG. 13, when the length of a portion of the long axis of the ellipse overlapping signal line 102 is defined as b, and the lengths up to rectangular ends adjacent to the portion of the long axis of the ellipse are defined as a and c, respectively, the relationship of a+c>b is to be satisfied. Thereby, it is not necessary to accurately design the length of b, so that design costs can be reduced.

Figure 14:
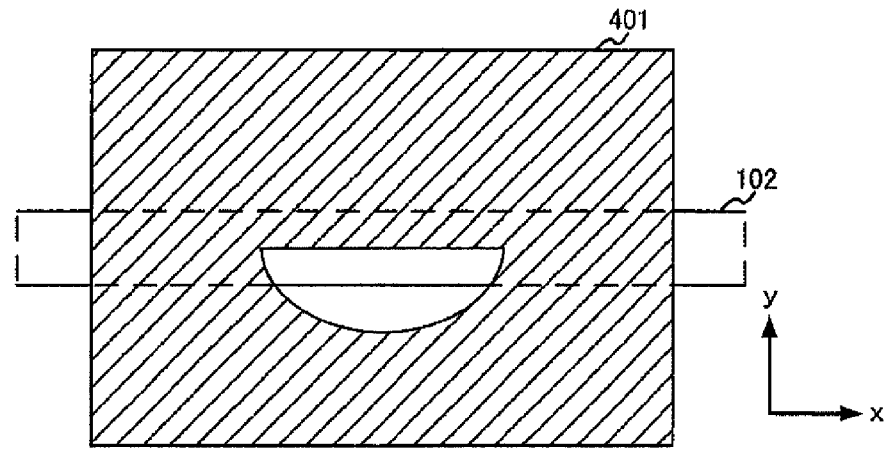
FIG. 14 is a plan view illustrating still another wiring structure according to Embodiment 3 of the present invention.

Further, the present invention is not limited to the elliptical through hole shown in FIG. 12. As shown in FIG. 14, the through hole may have a semi-elliptical shape obtained by cutting out the upper half of the ellipse. The semi-elliptical through hole overlaps a portion of the width of the signal line. In FIGS. 12 and 13, an example is shown in which impedance is adjusted by adjusting the length of the ellipse in a long-axis direction (x-axis direction in the drawing). On the other hand, in FIG. 14, an example is shown in which impedance is adjusted by adjusting the length of the ellipse in a short-axis direction (y-axis direction in the drawing). Here, although the semi-elliptical shape obtained by cutting out the upper half of the ellipse is shown by way of example, the amount of cutting out is not limited to a half, and varies depending on the amount of the adjustment of the impedance.

Meanwhile, in the present embodiment, a case has been described in which the shapes of the through hole are elliptical and semi-elliptical, but the present invention may employ a circular shape or a rectangular shape without being limited to the shapes described in the present embodiment.

(Embodiment 4)

In Embodiment 4 of the present invention, a case will be described in which impedance matching in the signal line is performed in the ground layer on which a land pattern is formed. Meanwhile, the land pattern is used to dispose a leg for further stacking components or a plurality of boards on a board in which the ground layer is formed.

Figure 15:
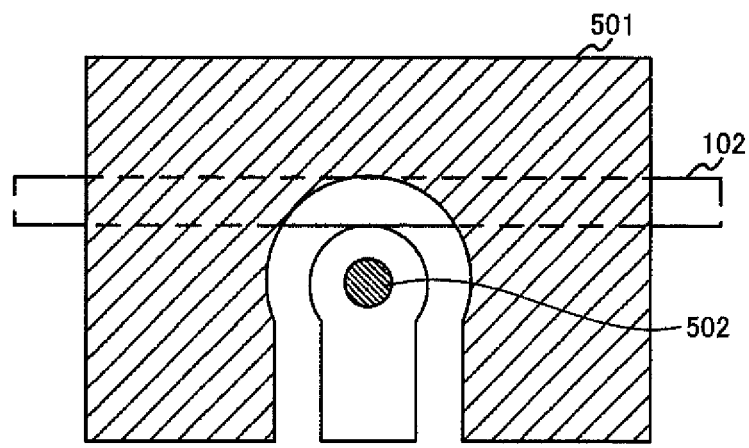
FIG. 15 is a plan view illustrating a wiring structure having a land pattern before impedance adjustment.

FIG. 15 is a plan view illustrating a wiring structure having a land pattern before impedance adjustment. In FIG. 15, land pattern 502 is formed on ground layer 501, and a through hole is formed in the vicinity of land pattern 502. FIG. 15 shows a state where a portion of the through hole overlaps signal line 102.

Figure 16:
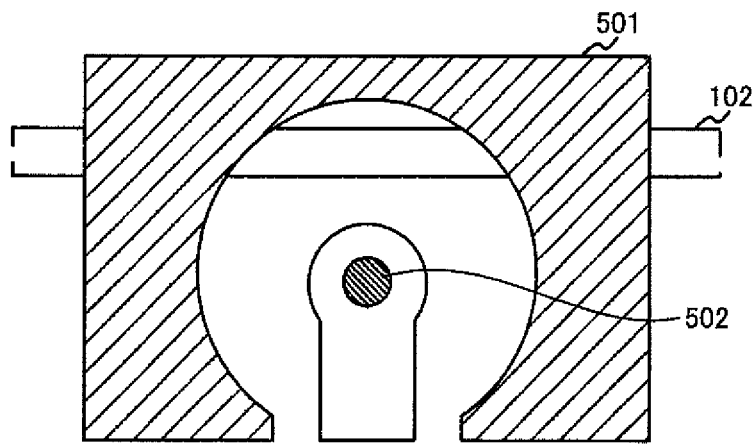
FIG. 16 is a plan view illustrating a wiring structure having a land pattern according to Embodiment 4 of the present invention.

FIG. 16 is a plan view illustrating a wiring structure having a land pattern according to Embodiment 4 of the present invention. In ground layer 501, a through hole expanded with respect to the through hole of FIG. 15 is formed in the vicinity of land pattern 502. A portion of the through hole overlaps signal line 102 in a large area compared to the case with the through hole of FIG. 15. In this manner, the through hole is expanded, and signal line 102 and ground layer 501 are separated from each other, thereby allowing impedance to be adjusted.

Figure 17:
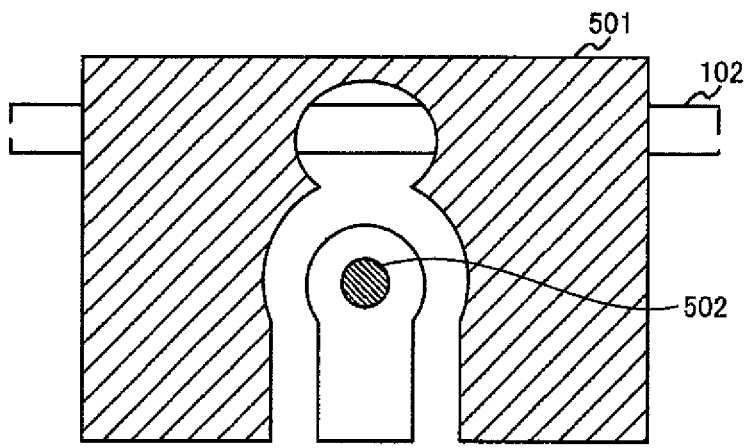
FIG. 17 is a plan view illustrating another wiring structure having a land pattern according to Embodiment 4 of the present invention.

The present invention is not limited to the through hole illustrated in FIG. 16. As illustrated in FIG. 17, an elliptical through hole may be provided continuously with the through hole of FIG. 15, In this case, the elliptical through hole and signal line 102 overlap each other, and signal line 102 and ground layer 501 are separated from each other, thereby allowing impedance to be adjusted.

(Another Embodiment)

Figure 18:
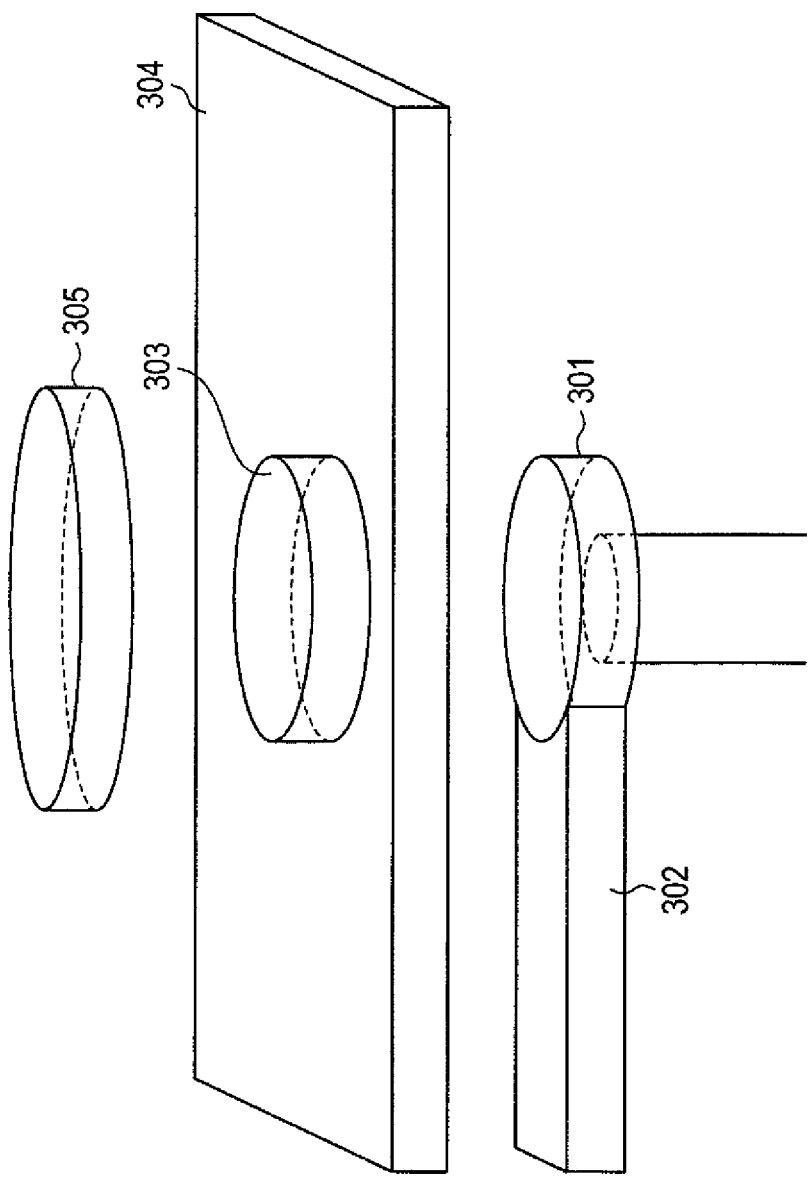
FIG. 18 is an exploded perspective view illustrating a wiring structure including a via according to another embodiment of the present invention.

FIG. 18 is an exploded perspective view illustrating a wiring structure including a via according to another embodiment of the present invention. The wiring structure in FIG. 18 includes signal line 302 (layer 3) connected to via 301, ground layer 304 (layer 2) having circular through hole 303 formed at a position facing via 301, and metal film 305 (layer 1) that covers through hole 303 of ground layer 304.

Providing the metal film as layer 1 makes it possible to increase the length of a path in which the via connecting part and the ground are bound to each other. Specifically, most of electromagnetic wave components which are not radiated by reducing the size of the through hole are bound to the metal film, and the metal film is bound to the ground in a transverse direction because of its thickness. However, the comprehensive degree of binding can be reduced by going through the metal film.

Meanwhile, in each of the above-mentioned embodiments, the through hole is equivalent to a pattern not covered with the metal film.

The disclosure of Japanese Patent Application No. 2011-289371, filed on Dec. 28, 2011, including the specification, drawing and abstract, is incorporated herein by reference in its entirety.

INDUSTRIAL APPLICABILITY

The multilayer wiring board according to the present invention can be applied to a communication apparatus that processes a high-frequency signal, or the like, for example.

REFERENCE SIGNS LIST 101, 104, 201, 304, 401, 501 Ground layer
102, 103, 302 Signal line
105, 301 Via
303 Through hole
305 Metal film
502 Land pattern

The invention claimed is:

1. A multilayer wiring board comprising:
a via that connects a plurality of inner layers; and
a ground layer that forms an outer layer distinct from the plurality of inner layers along a direction perpendicular to layer surfaces, the ground layer including a metal film formed to define a cut pattern where no metal film is present at a position facing the via, the cut pattern overlapping a first portion of the via while not overlapping a second portion of the via.

2. The multilayer wiring board according to claim 1, wherein the cut pattern has any one of a circular shape, an elliptical shape, and a rectangular shape.

3. The multilayer wiring board according to claim 2, wherein the cut pattern has any one of a letter-C- shape and an n-cut shape.

4. The multilayer wiring board according to claim 1, wherein the ground layer includes a through hole having a length of $\lambda/4$ along a signal line connected to the via.

5. The multilayer wiring board according to claim 4, wherein the through hole has any one of a rectangular shape, a protruding shape, and a taper shape.

* * * * *